United States Patent
Youn et al.

(10) Patent No.: US 7,629,677 B2
(45) Date of Patent: Dec. 8, 2009

(54) SEMICONDUCTOR PACKAGE WITH INNER LEADS EXPOSED FROM AN ENCAPSULANT

(75) Inventors: Sun-Pil Youn, Seoul (KR); Jong-Woo Ko, Gyeonggi-do (KR); Jeong-Jin Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 281 days.

(21) Appl. No.: 11/555,182

(22) Filed: Oct. 31, 2006

(65) Prior Publication Data

US 2008/0073759 A1 Mar. 27, 2008

(30) Foreign Application Priority Data

Sep. 21, 2006 (KR) .................. 10-2006-0091793

(51) Int. Cl.
*H01L 23/495* (2006.01)
*H01R 9/00* (2006.01)
*H01L 21/00* (2006.01)

(52) U.S. Cl. ............... 257/676; 257/686; 257/693; 257/787; 257/E23.031; 257/E23.043; 361/773; 361/813; 438/123

(58) Field of Classification Search .................. None
See application file for complete search history.

(56) References Cited

U.S. PATENT DOCUMENTS

| | | | | |
|---|---|---|---|---|
| 5,602,420 A * | 2/1997 | Ogata et al. | ............... | 257/686 |
| 5,625,221 A * | 4/1997 | Kim et al. | ............... | 257/686 |
| 5,970,320 A * | 10/1999 | Yamasaki et al. | ............... | 438/123 |
| 6,081,029 A * | 6/2000 | Yamaguchi | ............... | 257/718 |
| 6,208,020 B1 * | 3/2001 | Minamio et al. | ............... | 257/684 |
| 6,424,031 B1 * | 7/2002 | Glenn | ............... | 257/686 |
| 6,462,424 B1 * | 10/2002 | Seki et al. | ............... | 257/778 |
| 6,650,012 B1 * | 11/2003 | Takahashi | ............... | 257/730 |
| 6,730,544 B1 * | 5/2004 | Yang | ............... | 438/110 |

(Continued)

FOREIGN PATENT DOCUMENTS

JP 59155152 A * 9/1984

(Continued)

OTHER PUBLICATIONS

English language abstract for Korean Publication No. 2001-0038940, May 15, 2001.

(Continued)

*Primary Examiner*—Alonzo Chambliss
(74) *Attorney, Agent, or Firm*—Volentine & Whitt, PLLC

(57) ABSTRACT

Provided is a semiconductor package including a high integration semiconductor chip and having a minimum area to be mounted on a circuit board. The semiconductor package includes a semiconductor chip, a plurality of inner leads, and an encapsulant. The plurality of inner leads include upper and bottom surfaces and are electrically connected to the semiconductor chip. The encapsulant covers the semiconductor chip and the plurality of inner leads. The upper surfaces of the plurality of inner leads are fixed to the encapsulant, portions of the bottom surfaces of the plurality of inner leads are exposed from the encapsulant, and the bottom surfaces of the plurality of inner leads are disposed at a different height from a bottom surface of the encapsulant.

29 Claims, 6 Drawing Sheets

U.S. PATENT DOCUMENTS

| | | | |
|---|---|---|---|
| 6,753,599 B2 * | 6/2004 | Kim | 257/686 |
| 6,790,711 B2 * | 9/2004 | Takahashi | 438/123 |
| 7,279,784 B2 * | 10/2007 | Liu | 257/686 |
| 7,315,077 B2 * | 1/2008 | Choi et al. | 257/666 |
| 2002/0100963 A1 * | 8/2002 | Suzuki et al. | 257/678 |
| 2004/0051168 A1 * | 3/2004 | Arai et al. | 257/678 |
| 2005/0093117 A1 * | 5/2005 | Masuda et al. | 257/676 |
| 2007/0111393 A1 * | 5/2007 | Burghout et al. | 438/123 |

FOREIGN PATENT DOCUMENTS

| | | |
|---|---|---|
| JP | 09-153561 | 6/1997 |
| JP | 2004-349316 | 12/2004 |
| KR | 2001-0038940 | 5/2001 |
| KR | 10-0331841 | 3/2002 |

OTHER PUBLICATIONS

English language abstract for Korean Publication No. 10-0331841, Mar. 26, 2002.

English language abstract for Japanese Publication No. 09-153561, Jun. 10, 1997.

* cited by examiner

SEMICONDUCTOR PACKAGE WITH INNER LEADS EXPOSED FROM AN ENCAPSULANT

CROSS-REFERENCE TO RELATED PATENT APPLICATION

This application claims the benefit of Korean Patent Application No. 10-2006-0091793, filed on Sep. 21, 2006, in the Korean Intellectual Property Office, the disclosure of which is incorporated herein in its entirety by reference.

BACKGROUND

1. Technical Field

The disclosure relates to a semiconductor package, and more particularly, to a single or stacked semiconductor package to enable high integration of semiconductor chips.

2. Description of the Related Art

Assembling technology for manufacturing semiconductor packages has been greatly developed with the advancement of technology for highly integrated, thin semiconductor devices. In particular, the sizes of semiconductor packages have been greatly reduced to achieve semiconductor products that are compact and light. Modern semiconductor products require a high capacity semiconductor package. Thus, a stacked semiconductor package formed of a stack of a plurality of semiconductor packages or a multi-chip semiconductor package including a plurality of semiconductor chips is used.

FIGS. 1 and 2 are cross-sectional views of conventional semiconductor packages. Referring to FIG. 1, in a conventional semiconductor package 10, a molding resin 16 exists on a semiconductor chip 14 and underneath a chip mounting pad 12, and the semiconductor chip 14 is mounted on the chip mounting pad 12 using an adhesive 13. In other words, the molding resin 16 encloses the semiconductor chip 14, the chip mounting pad 12, and wires 15. It is important that the molding resin 16 fully enclose the top of the semiconductor chip 14 and wires 15 to protect these components from physical damage. Further, wires 15 are typically formed in a loop shape in order to improve the strength of the electrical connection. This means that the molding resin 16 has to be thick enough to enclose the full height of the loops in the wires 15. Thus, the semiconductor package 10 is thick due to the thickness of the molding resin 16. In addition, leads 11 protrude from sides of the molding resin 16 and extend below the molding resin 16 to mount the semiconductor package 10 on a circuit board (not shown). Thus, the size of the semiconductor package 10 is further increased.

Referring to FIG. 2, a semiconductor package 20 has a structure in which lower and upper semiconductor packages 20a and 20b are stacked. The lower and upper semiconductor packages 20a and 20b may refer to the semiconductor package 10 illustrated in FIG. 1. However, leads 11a and 11b may be deformed to be connected to each other, The total thickness of the semiconductor package 20 increases with increases in the thicknesses of the lower and upper semiconductor packages 20a and 20b.

To solve these problems, a method of forming leads of a semiconductor package to be parallel with the molding resin has been suggested. However, a stack structure of such semiconductor packages has a problem of low reliability of the electrical connection between leads of the upper and lower semiconductor packages. Furthermore, it is difficult for a plurality of semiconductor chips to be mounted due to the disposition of the leads of the upper and lower semiconductor packages.

SUMMARY

The disclosure provides a semiconductor package including a highly integrated semiconductor chip and having a minimum height to be mounted on a circuit board.

The disclosure also provides a semiconductor package including a plurality of semiconductor chips and having a minimum height to be mounted on a circuit board. Methods of manufacturing both single and stacked packages with minimum height are also disclosed.

In one embodiment, a semiconductor package comprises a semiconductor chip; a plurality of inner leads comprising upper surfaces and bottom surfaces, the plurality of inner leads electrically connected to the semiconductor chip; and an encapsulant covering the semiconductor chip and the plurality of inner leads, wherein portions of the bottom surfaces of the inner leads are exposed from the encapsulant and the bottom surfaces of the inner leads are disposed at a different height from a bottom surface of the encapsulant.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
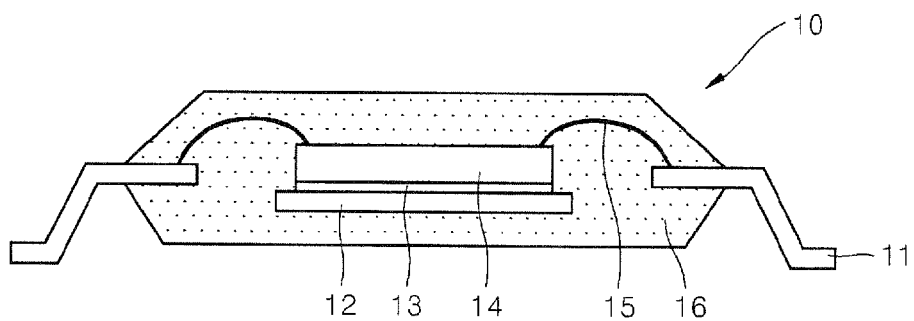
FIGS. 1 and 2 are cross-sectional views of conventional semiconductor packages.
Figure 2:
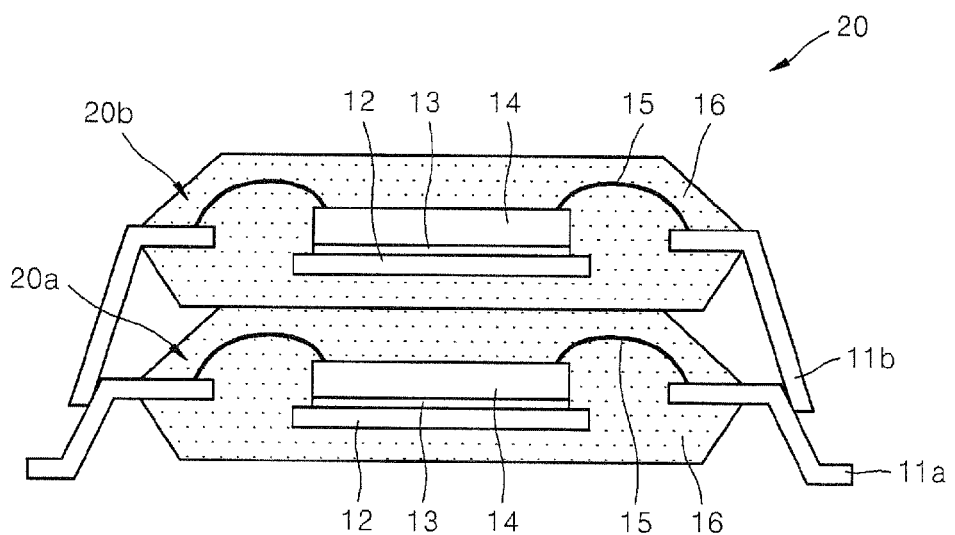

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

Also, the embodiments of the invention will be described with reference to exemplary cross-sectional views. Thus, forms of the exemplary cross-sectional views may be modified due to manufacturing techniques and/or allowed tolerances. The embodiments of the invention are not limited to shown specific forms but may include forms generated according to manufacturing processes. Therefore, areas illustrated in the drawings have approximate attributes, shapes of the areas are to exemplify specific forms of semiconductor package areas, and the areas do not limit the scope of the invention. Also, when it is described that a layer exists on another layer, it means that the layer may exist on the other layer or a third layer may be interposed therebetween.

In embodiments of the invention, a semiconductor package may have a single or stacked structure. Also, inner leads and outer leads may be defined separately. The inner leads refer to leads or portions of lead frames including surfaces attached to and fixed to an encapsulant, and the outer leads refer to leads or lead frames extending outside the encapsulant. Although the inner and outer leads are defined separately, the inner and outer leads may refer to a structure body which is virtually divided into inner and outer leads physically continuous to one another. Thus, in the embodiments of the invention, a semiconductor package may include only inner leads or may include inner leads and outer leads.

Figure 3:
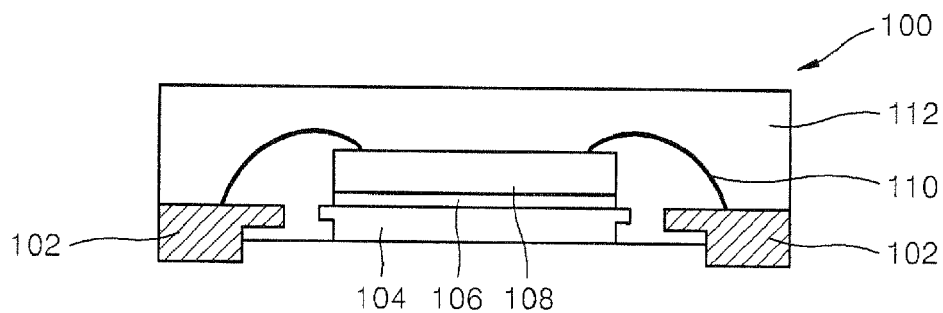
FIG. 3 is a cross-sectional view of a semiconductor package with exposed inner leads according to an embodiment of the invention.

FIG. 3 is a cross-sectional view of a semiconductor package 100 according to an embodiment of the invention. Referring to FIG. 3, a semiconductor chip 108 may be attached onto a chip mounting pad 104 using an adhesive member 106 and fixed by an encapsulant 112. The semiconductor chip 108 may include a memory device and/or a logic device. However, the invention is not limited to this type of device. Alternatively, the chip mount board 104 may include notches at its edge portions to increase an adhesive strength with the encapsulant 112. A bottom surface of the chip mounting pad 104 may be exposed from the encapsulant 112.

A plurality of inner leads 102 may be respectively and electrically connected to the semiconductor chip 108 by wires 110 and fixed by the encapsulant 112. For instance, the encapsulant 112 may cover the semiconductor chip 108, wires 110, and inner leads 102, thereby keeping them physically positioned with respect to each other and protecting them from physical damage and thermal cycling failure. The encapsulant may include a molding resin having an epoxy. The inner leads 102 may include upper surfaces to which the wires 110 are connected and bottom surfaces opposite to the upper surfaces. The upper surfaces of the inner leads 102 may be attached to and enclosed by the encapsulant 112. At least portions of the bottom surfaces of the inner leads 102 may be exposed from the encapsulant 112. In addition, sides of the inner leads 102 may be exposed from the encapsulant 112. The exposed portions of the inner leads 102 may be used for connecting to another semiconductor package in a stack structure or they may operate as external terminals. The semiconductor package 100 may be called an exposed lead package (ELP) due to the exposed structures of the inner leads 102. However, the scope of the invention is not limited to this name.

The inner leads 102 may include notches to increase their adhesive strength with the encapsulant 112. As shown in FIG. 3, portions of the inner leads 102 may extend inward toward the semiconductor chip 108 in the encapsulant 112 due to the notches, and thus the adhesive strength between the inner leads 102 and the encapsulant 112 may be increased. In an exemplary modification of the present embodiment, the inner leads 102 may include holes instead of the notches to increase the adhesive strength with the encapsulant 112. The notches or the holes may be formed using a half etching method.

The bottom surfaces of the inner leads 102 may protrude below the bottom surface of the encapsulant 112. Also, in a modification example of the present embodiment, the bottom surfaces of the inner leads 102 may be modified within a range in which the bottom surfaces of the inner leads 102 have different heights from the bottom surface of the encapsulant 112. As will be described later, the bottom surfaces of the inner leads 102 protruding from the encapsulant 112 may contribute to increasing the reliability of an electrical connection in a stacked semiconductor package. In addition, the semiconductor package 100 may be mounted on a circuit board having wiring lines, and the inner leads 102 protruding from the bottom surface of the encapsulant 112 may contribute to increasing the reliability of the electrical connection between the semiconductor package 100 and the circuit board (refer to FIG. 10, for example).

In a modification of the present embodiment, the chip mounting pad 104 may be omitted, and thus the semiconductor chip 108 may be disposed above the inner leads 102 to be electrically connected to the inner leads 102. This structure may be called a lead on chip (LOC) structure.

Figure 4:
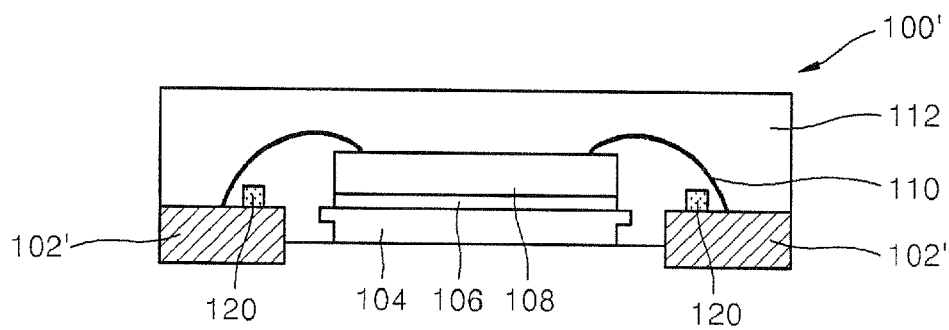
FIG. 4 is a cross-sectional view of a semiconductor package with non-conductive protrusions according to another embodiment of the invention.

FIG. 4 is a cross-sectional view of a semiconductor package with non-conductive protrusions according to another embodiment of the invention. A semiconductor package 100' is a modification example of the semiconductor package 100 illustrated in FIG. 3. Thus, repeated descriptions will be omitted herein.

Referring to FIG. 4, the semiconductor package 100' further includes nonconductive intermediate members 120 between the encapsulant 112 and the inner leads 102'. The nonconductive intermediate members 120 extend across at least portions of the inner leads 102' to increase the adhesive strength between the encapsulant 112 and the inner leads 102'. For example, the nonconductive intermediate members 120 may extend across upper surfaces of the inner leads 102' and have bar shapes. Thus, in the present embodiment, the inner leads 102' may not include notches.

Figure 5:
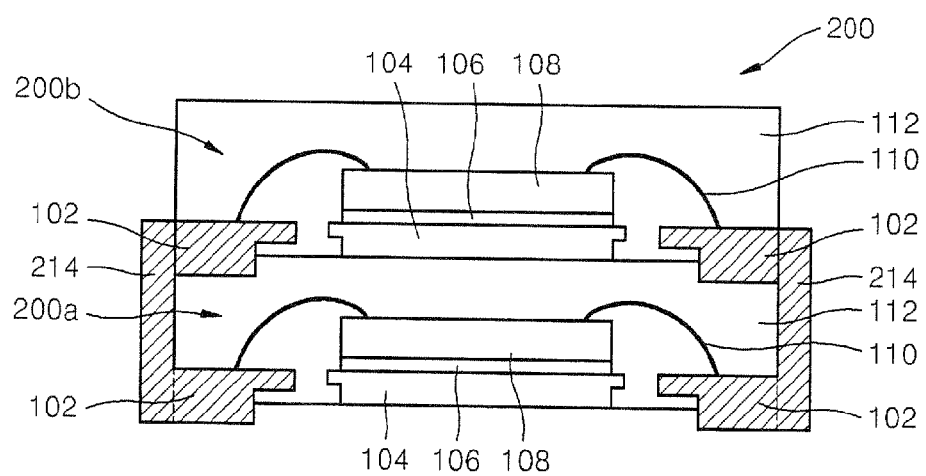
FIG. 5 is a cross-sectional view of a stacked semiconductor package according to another embodiment of the invention.

FIG. 5 is a cross-sectional view of a stacked semiconductor package according to another embodiment of the invention. Referring to FIG. 5, a semiconductor package 200 has a stack structure in which lower and upper semiconductor packages 200a and 200b are stacked. Thus, the semiconductor package 200 may be called a stacked semiconductor package. The lower and upper semiconductor packages 200a and 200b may refer to the semiconductor package 100 illustrated in FIG. 3, and thus their detailed descriptions will be omitted herein. In addition, the lower and/or upper semiconductor packages 200a and 200b may be easily modified into the semiconductor package 100' illustrated in FIG. 4.

Inner leads 102 of the lower semiconductor package 200a are electrically connected to inner leads 102 of the upper semiconductor package 200b through outer leads 214. For example, the outer leads 214 may be physically continuous to the inner leads 102 of the lower semiconductor package 200a. Leads or lead frames including the inner leads 102 and the outer leads 214 of the lower semiconductor package 200a may be formed upward to easily form this structure. The outer leads 214 may be shaped by a standard trim and form process as is known in the art. The inner leads 102 of the upper semiconductor package 200b may be electrically connected to the outer leads 214 using solder bonding. For example, the outer leads 214 may be soldered onto exposed sidewalls of the inner leads 102 of the upper semiconductor package 200b to increase the contact area so as to lower the contact resistance of the electrical connection.

However, in a modification example of the present embodiment, the outer leads 214 may be physically continuous to the inner leads 102 of the upper semiconductor package 200b. In this case, the inner leads 102 of the lower semiconductor package 200a may be electrically connected to the outer leads 214 using solder bonding. In another modification example of the present embodiment, the outer leads 214 may be soldered to the inner leads 102 of the lower and upper semiconductor packages 200a and 200b.

A portion of an upper surface of an encapsulant 112 of the lower semiconductor package 200a may be recessed. For example, the protruding inner leads 102 of the upper semiconductor package 200b can be placed on the recessed portion of the encapsulant 112 of the lower semiconductor package 200a. Simultaneously, a bottom surface of the encapsulant 112 of the upper semiconductor package 200b may be placed on the other portion of the encapsulant 112 of the lower semiconductor package 112 which is not recessed. This structure may increase the stability of a stack of the lower and upper semiconductor packages 200a and 200b. Furthermore, the encapsulants 112 of the lower and upper semiconductor packages 200a and 200b may directly contact each other. Thus, an entire height of the stacked semiconductor package 200 may be reduced, as compared to prior art methods. In other words, another material does not need to be interposed between the encapsulants 112 of the lower and upper semiconductor packages 200a and 200b.

In addition, a plurality of semiconductor chips may be further stacked in each of the lower and upper semiconductor packages 200a and 200b. In this case, heights of the encapsulants 112 and lengths of the outer leads 214 may be adjusted to easily increase a number of semiconductor chips mounted in the lower and upper semiconductor packages 200a and 200b. In other words, the outer leads 214 are not formed inside the encapsulants 112, and thus the lengths of the outer leads 214 are not limited. However, if the outer leads 214 are formed using a half etching process as in the prior art, the lengths of the outer leads 214 may be limited.

Figure 6:
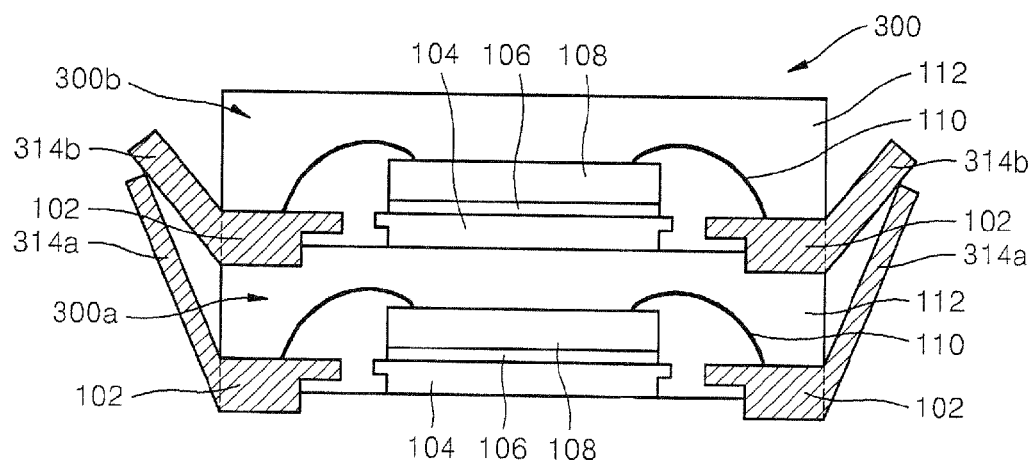
FIG. 6 is a cross-sectional view of a stacked semiconductor package with two sets of external leads according to another embodiment of the invention.

FIG. 6 is a cross-sectional view of a semiconductor package according to another embodiment of the invention. A semiconductor package 300 has a stack structure in which lower and upper semiconductor package 300a and 300b are stacked. The lower and upper semiconductor packages 300a and 300b may refer to the semiconductor package 100 illustrated in FIG. 3, and thus their detailed descriptions will be omitted herein. In addition, the lower and/or upper semiconductor packages 300a and 300b may be easily modified into the semiconductor package 100' illustrated in FIG. 4.

Inner leads 102 of the lower semiconductor package 300a may be connected to inner leads 102 of the upper semiconductor package 300b through first and second outer leads 314a and 314b. The first outer leads 314a may be physically continuous to the inner leads 102 of the lower semiconductor package 300a, and the second outer leads 314b may be physically continuous to the inner leads 102 of the upper semiconductor package 300b. The first outer leads 314a may be disposed at a different angle from an angle at which the second leads 314b are disposed and may be connected to the second leads 314b using solder bonding.

In addition, as described with reference to FIG. 5, a plurality of semiconductor chips may be further stacked in each of the lower and upper semiconductor packages 300a and 300b. For example, each semiconductor package may comprise a memory chip and a logic chip, a plurality of memory chips, or some other combination of semiconductor chips.

Figure 7:
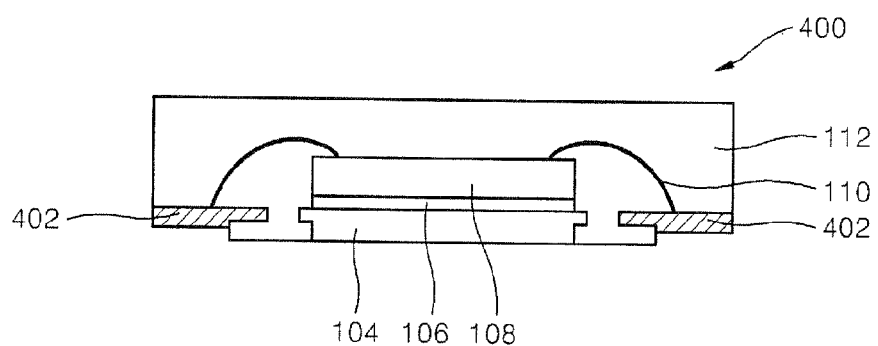
FIG. 7 is a cross-sectional view of a semiconductor package with recessed inner leads according to another embodiment of the invention.

FIG. 7 is a cross-sectional view of a semiconductor package according to another embodiment of the invention. A semiconductor package 400 according to the present embodiment is a modification example of the semiconductor package 100 illustrated in FIG. 3. Thus, its detailed descriptions will be omitted herein.

Referring to FIG. 7, bottom surfaces of inner leads 402 are recessed from a bottom surface of an encapsulant 112. The recessed structure of the inner leads 402 may be compared with the protruding inner leads 102 illustrated in FIG. 3. As will be described later, the bottom surfaces of the inner leads 402 recessed in the encapsulant 112 may increase the reliability of an electrical connection in a semiconductor package having a stack structure. In addition, the semiconductor package 400 may be mounted on a circuit board having wiring lines, and the inner leads 402 recessed in the bottom surface of the encapsulant 112 may contribute to increasing the reliability of the electrical connection between the semiconductor package 400 and the circuit board (refer to FIGS. 8 and 9).

Figure 8:
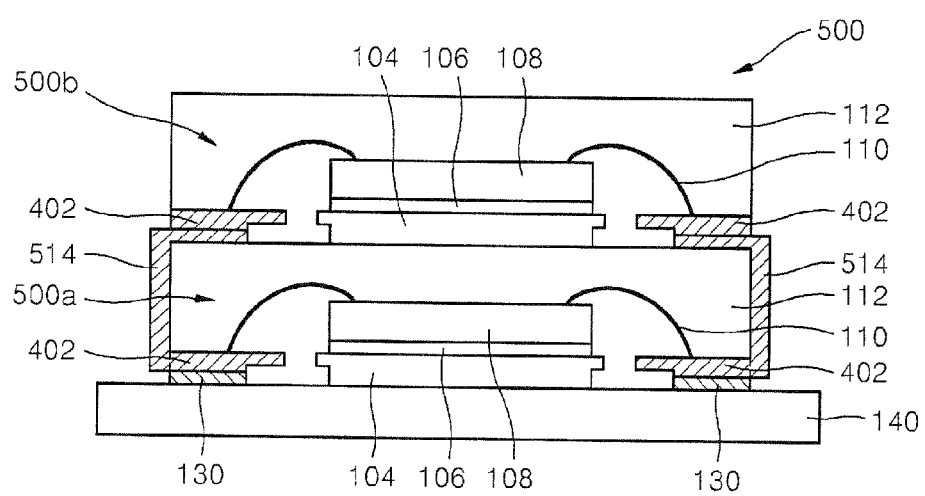
FIG. 8 is a cross-sectional view of a stacked semiconductor package mounted on a circuit board according to another embodiment of the invention.

FIG. 8 is a cross-sectional view of a semiconductor package according to another embodiment of the invention. Referring to FIG. 8, a semiconductor package 500 has a stack structure in which lower and upper semiconductor packages 500a and 500b are stacked. The lower and upper semiconductor packages 500a and 500b may refer to the semiconductor package 400 illustrated in FIG. 7, and thus their detailed descriptions will be omitted herein.

Inner leads 402 of the lower semiconductor package 500 are electrically connected to inner leads 402 of the upper semiconductor package 500b through outer leads 514. For example, the outer leads 514 may be physically continuous to the inner leads 402 of the lower semiconductor package 500a. In addition, ends of the outer leads 514 may be formed to be interposed between an encapsulant 112 of the lower semiconductor package 500a and the inner leads 402 of the upper semiconductor package 500b. The ends of the outer leads 514 may be electrically connected to the inner leads 402 of the upper semiconductor package 500b using solder bonding. In this structure, contact areas between the inner leads 402 of the upper semiconductor package 500b and the outer leads 514 are very great. Thus, a contact resistance may be reduced to improve the contact reliability.

In the present embodiment, thicknesses of the ends of the outer leads 514 may be equal to recessed depths of the inner leads 402 of the upper semiconductor package 500b. Thus, encapsulants 112 of the lower and upper semiconductor packages 500a and 500b may directly contact each other without additional recessed portions. As a result, the height of the semiconductor package 500 may not be additionally increased due to a stack of the lower and upper semiconductor packages 500a and 500b. Also, the semiconductor package 500 may have a small volume.

The inner leads 402 of the lower semiconductor package 500a may be electrically connected to wiring lines 130 of a circuit board 140. The wiring lines 130 may protrude above a surface of the circuit board 140 to place the inner leads 402 and the encapsulant 112 of the lower semiconductor package 500a thereon. Thus, the encapsulant 112 of the lower semiconductor package 500a may directly contact the surface of the circuit board 140. As a result, the height of the semiconductor package 500 is equal to a sum of heights of the lower and upper semiconductor packages 500a and 500b and the circuit board 140. Therefore, the semiconductor package 500 may have a very dense structure and a small volume.

In addition, as described with reference to FIG. 5, a plurality of semiconductor chips may be easily further stacked in each of the lower and upper semiconductor packages 500a and 500b.

Figure 9:
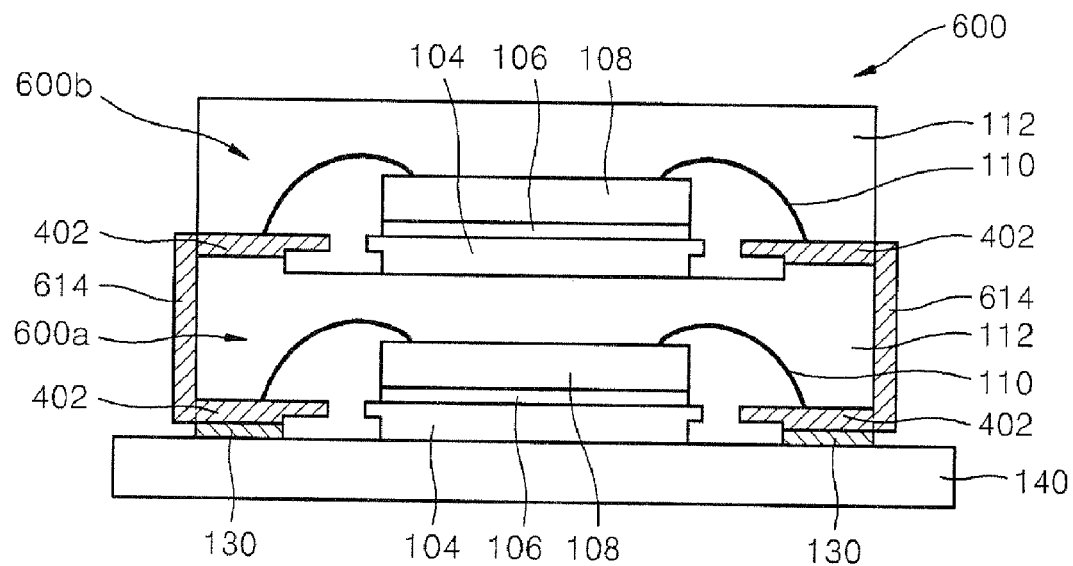
FIG. 9 is a cross-sectional view of a stacked semiconductor package mounted on a circuit board according to another embodiment of the invention.

FIG. 9 is a cross-sectional view of a semiconductor package according to another embodiment of the invention. Referring to FIG. 9, a semiconductor package 600 has a stack structure in which lower and upper semiconductor packages 600a and 600b are stacked. The lower and upper semiconductor packages 600a and 600b may refer to the semiconductor package 400 illustrated in FIG. 7, and thus their detailed descriptions will be omitted herein. Furthermore, the semiconductor package 600 is a modification example of the semiconductor package 500 illustrated in FIG. 8 and thus may refer to FIG. 8.

Inner leads 402 of the lower semiconductor package 600 are electrically connected to inner leads 402 of the upper semiconductor package 600b through outer leads 614. For example, ends of the outer leads 614 may be physically continuous to the inner leads 402 of the upper semiconductor package 600b, and other ends of the outer leads 614 may be soldered onto exposed sidewalls of the inner leads 402 of the upper semiconductor package 600b.

However, in a modification example of the present embodiment, both the ends of the outer leads 614 may be soldered onto the inner leads 402 of the lower and upper semiconductor packages 600a and 600b.

A portion of an upper surface of an encapsulant 112 of the lower semiconductor package 600a may be recessed. For example, an encapsulant 112 of the upper semiconductor package 600b may be placed on the recessed portion of the encapsulant 112 of the lower semiconductor package 600a. Thus, the encapsulants 112 of the lower and upper semiconductor packages 600a and 600b may directly contact each other. As a result, an entire height of the semiconductor package 600 may be decreased to increase a stack density.

Figure 10:
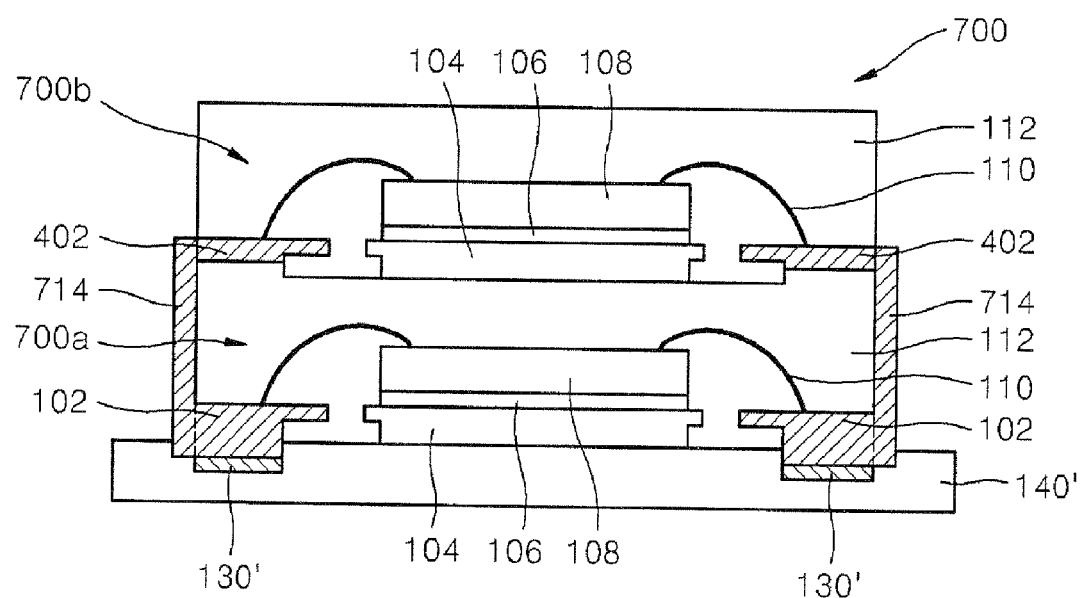
FIG. 10 is a cross-sectional view of a stacked semiconductor package mounted on a circuit board with recessed wiring lines according to another embodiment of the invention.

FIG. 10 is a cross-sectional view of a semiconductor package according to another embodiment of the invention. Referring to FIG. 10, a semiconductor package 700 has a stack structure in which lower and upper semiconductor packages 700a and 700b are stacked. The lower semiconductor package 700a may refer to the semiconductor package 100 illustrated in FIG. 3, and the upper semiconductor package 700b may refer to the semiconductor package 400 illustrated in FIG. 7. Thus, detailed descriptions of the lower and upper semiconductor packages 700a and 700b will be omitted herein.

Inner leads 102 of the lower semiconductor package 700a are electrically connected to inner leads 402 of the upper semiconductor package 700b through outer leads 714. For example, ends of the outer leads 714 may be physically continuous to the inner leads 102 of the lower semiconductor package 700a, and other ends of the outer leads 714 may be soldered onto sidewalls of the inner leads 402 of the upper semiconductor package 700b.

However, in a modification example of the present embodiment, the ends of the outer leads 714 may be physically continuous to the inner leads 402 of the upper semiconductor package 700b, and the other ends of the outer leads 714 may be soldered onto sidewalls of the inner leads 102 of the lower semiconductor package 700a. In another modification example of the present embodiment, both the ends of the outer leads 714 may be respectively soldered onto the inner leads 102 of the lower semiconductor package 700a and the inner leads 402 of the upper semiconductor package 700b.

A portion of an upper surface of an encapsulant 112 of the lower semiconductor package 700a may be recessed. For example, an encapsulant 112 of the upper semiconductor package 700b may be placed on the recessed portion of the encapsulant 112 of the lower semiconductor package 700a. Thus, the encapsulants 112 of the lower and upper semiconductor packages 700a and 700b may directly contact each other. As a result, an entire height of the semiconductor package 700 may be decreased to increase a stack density.

The inner leads 102 of the lower semiconductor package 700a may be electrically connected to wiring lines 130' of a circuit board 140'. The wiring lines 130' may be recessed in a surface of the circuit board 140' to place the inner leads 102 and the encapsulant 112 of the lower semiconductor package 700a thereon. Thus, the encapsulant 112 of the lower semiconductor package 700a may directly contact the surface of the circuit board 140'. As a result, a height of the semiconductor package 700 is equal to a sum of heights of the lower and upper semiconductor packages 700a and 700b and the circuit board 140'. Therefore, the semiconductor package 700 may have a very dense structure and a small volume.

In addition, as described with reference to FIG. 5, a plurality of semiconductor chips may be easily further stacked in each of the lower and upper semiconductor packages 700a and 700b.

Figure 11:
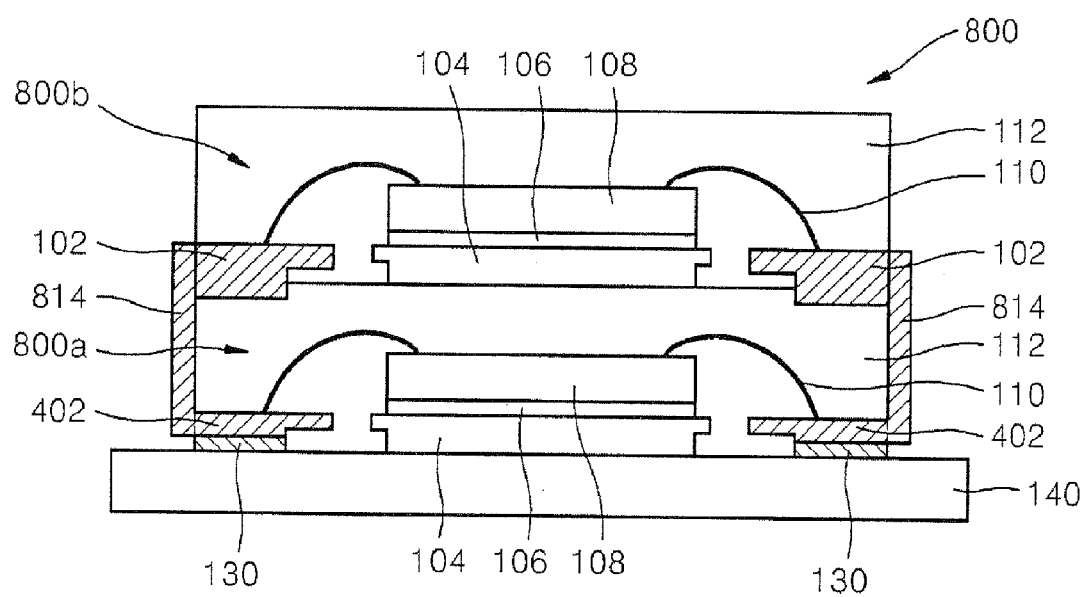
FIG. 11 is a cross-sectional view of a stacked semiconductor package mounted on a circuit board with protruded wiring lines according to another embodiment of the invention.

FIG. 11 is a cross-sectional view of a semiconductor package according to another embodiment of the invention. Referring to FIG. 11, a semiconductor package 800 has a stack structure in which lower and upper semiconductor packages 800a and 800b are stacked. The lower semiconductor package 800a may refer to the semiconductor package 400 illustrated in FIG. 7, and the upper semiconductor package 800b may refer to the semiconductor package 100 illustrated in FIG. 3. Thus, detailed descriptions of the lower and upper semiconductor packages 800a and 800b will be omitted herein.

Inner leads 402 of the lower semiconductor package 800a are electrically connected to inner leads 102 of the upper semiconductor package 800b through outer leads 814. For example, ends of the outer leads 814 may be physically continuous to the inner leads 402 of the lower semiconductor package 800a, and other ends of the outer leads 814 may be soldered onto sidewalls of the inner leads 102 of the upper semiconductor package 800b.

However, in a modification example of the present embodiment, the ends of the outer leads 814 may be physically continuous to the inner leads 102 of the upper semiconductor package 800b, and the other ends of the outer leads 814 may be soldered onto sidewalls of the inner leads 402 of the lower semiconductor package 800a. In another modification example of the present embodiment, both the ends of the outer leads 714 may be respectively soldered onto the inner leads 402 of the lower semiconductor package 800a and the inner leads 102 of the upper semiconductor package 800b.

A portion of an upper surface of an encapsulant 112 of the lower semiconductor package 800a may be recessed. For example, the inner leads of the upper semiconductor package 800b may be placed on the recessed portion of the encapsulant 112 of the lower semiconductor package 800a. Thus, the encapsulants 112 of the lower and upper semiconductor packages 800a and 800b may directly contact each other. As a result, an entire height of the semiconductor package 800 may be decreased to increase a stack density.

The inner leads 402 of the lower semiconductor package 800a may be electrically connected to wiring lines 130 of a circuit board 140. The wiring lines 130 may be protruded from a surface of the circuit board 140 to place the inner leads 402 and the encapsulant 112 of the lower semiconductor package 800a thereon. Thus, the encapsulant 112 of the lower semiconductor package 800a may directly contact the surface of the circuit board 140. As a result, a height of the semiconductor package 800 is equal to a sum of heights of the lower and upper semiconductor packages 800a and 800b and the circuit board 140. Therefore, the semiconductor package 800 may have a very dense structure and a small volume.

According to embodiments of the invention, a method for manufacturing a stacked semiconductor package includes forming a first and second package, stacking the second package on the first package, and electrically connecting the inner leads of the first and second packages. Forming a first package includes connecting a plurality of first inner leads to a first semiconductor chip with a plurality of first bond wires and encapsulating the first semiconductor chip, the first bond wires and a portion of the first inner leads with a first encapsulant, wherein the bottom surfaces of the first inner leads are recessed or protruded with respect to the bottom surface of the first encapsulant. Forming a second package includes connecting a plurality of second inner leads to a second semiconductor chip with a plurality of second bond wires and encapsulating the second semiconductor chip, the second bond wires and a portion of the second inner leads with a second encapsulant, wherein the bottom surfaces of the second inner leads are recessed or protruded with respect to the bottom surface of the second encapsulant.

As shown in FIG. 5 stacking the second package 200b on the first package 200a may include aligning the second package 200b over the first package 200a such that protruding second inner leads 102 of the second package 200b correspond to recesses formed in the upper surface of the first encapsulant 112 and placing the second package 200b in contact with the first package 200a, whereby the second inner leads 102 and the bottom surface of the second encapsulant contact the upper surface of the first encapsulant.

As shown in FIG. 6, electrically connecting the first inner leads to the second inner leads may include forming a plurality of first external leads 314a physically continuous with the first inner leads, forming a plurality of second external leads 314b physically continuous with the second inner leads, and physically connecting the first external leads to the second external leads. As an example, the first external leads 314a may be solder bonded to the second external leads 314b. The first external leads 314a may be formed at a first angle and the second external leads 314b may be formed at a second angle such that the first external leads 314a contact the second external leads 314b when the second package 300b is stacked on the first package 300a. Alternatively, the first external leads 314a and the second external leads 314b may be shaped to come in contact after the second package 300b is stacked on the first package 300a. As an example, this shaping process may be performed in a standard trim and form process as is known in the art.

As shown in FIG. 9, stacking the second package on the first package may include aligning the second package 600b over the first package 600a such that recessed second inner leads 402 of the second package 600b correspond to protrusions formed on the upper surface of the first encapsulant 112 and placing the second package 600b in contact with the first package 600a, whereby the second inner leads 402 and the bottom surface of the second encapsulant contact the upper surface of the first encapsulant.

As further shown in FIG. 9, electrically connecting the first inner leads to the second inner leads may include forming a plurality of first external leads physically continuous with the first inner leads and shaping the first external leads so as to contact exposed portions of the second inner leads. Alternatively, electrically connecting the first inner leads to the second inner leads may include forming a plurality of second external leads physically continuous with the second inner leads and shaping the second external leads so as to contact exposed portions of the first inner leads. Still another alternative would be solder bonding a plurality of external leads to exposed portions of the first and second inner leads, wherein the external leads are not physically continuous with either the first or second inner leads.

The method for manufacturing a stacked semiconductor package may further include forming a circuit board comprising a plurality of wiring lines and stacking the first package on the circuit board such that the bottom surface of the first package contacts the surface of the circuit board and the first inner leads contact the wiring lines.

As shown in FIG. 10, the wiring lines 130' may be recessed below the surface of the circuit board 140' such that stacking the first package 700a on the circuit board 140' includes aligning portions of the first inner leads 102 that protrude below the bottom surface of the first encapsulant 112 with the recessed wiring lines 130'.

As shown in FIG. 11, the wiring lines 130 may be protruded above the surface of the circuit board 140 such that stacking the first package 800a on the circuit board 140 includes aligning portions of the first inner leads 402 that are recessed into the first encapsulant 112 with the protruded wiring lines 130.

According to an aspect of the invention, there is provided a semiconductor package including: a semiconductor chip; a plurality of inner leads including upper surfaces and bottom surfaces and electrically connected to the semiconductor chip; and a encapsulant fixing the semiconductor chip and the plurality of inner leads, wherein the upper surfaces of the plurality of inner leads are fixed to the encapsulant, portions of the bottom surfaces of the inner leads are exposed from the encapsulant, and the bottom surfaces of the inner leads are disposed at a different height from a bottom surface of the encapsulant. The bottom surfaces of the inner leads may protrude or be recessed more than a bottom surface of the encapsulant.

The semiconductor package may further include a circuit board including wiring lines, wherein the wiring lines are connected to the bottom surfaces of the inner leads.

According to another aspect of the invention, there is provided a semiconductor package including upper and lower semiconductor packages sequentially stacked. Each of the upper and lower semiconductor packages may include: a semiconductor chip; a plurality of inner leads comprising upper surfaces and bottom surfaces and electrically connected to the semiconductor chip; and a encapsulant fixing the semiconductor chip and the inner leads, wherein the upper surfaces of the inner leads of the upper and lower semiconductor packages are fixed to the encapsulants, portions of the bottom surfaces of the inner leads are exposed from the encapsulants, the bottom surfaces of the inner leads are disposed at a different height from bottom surfaces of the encapsulants, and the inner leads of the upper semiconductor package are electrically connected to the inner leads of the lower semiconductor package.

The upper semiconductor package may further include outer leads physically continuous to the inner leads and exposed from the encapsulant, wherein the outer leads of the upper semiconductor package are connected to the inner leads of the lower semiconductor package.

The lower semiconductor package may further include outer leads physically continuous to the inner leads and exposed from the encapsulant, wherein the outer leads of the lower semiconductor package are connected to the inner leads of the upper semiconductor package.

Each of the upper and lower semiconductor packages may further include outer leads physically continuous to the inner leads and exposed from the encapsulant, wherein the outer leads of the upper semiconductor package are connected to the outer leads of the lower semiconductor package.

As described above, a semiconductor package according to the invention can have advantages when being mounted on a circuit board and forming a stack structure. Heights of inner leads can be adjusted to minimize an area to mount the semiconductor package on the circuit board having various wiring line structures.

Also, the inner leads and outer leads can be separated from an encapsulant to easily form a high density stack structure. The disposition of the outer leads can be adjusted so that upper and lower semiconductor packages contact each other. Thus, a plurality of semiconductor packages can be stacked at a high density.

In addition, the semiconductor package according to the invention can be easily applied to a multi-chip semiconductor package in which a plurality of semiconductor chips is mounted.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A semiconductor package comprising:
a semiconductor chip;
a plurality of inner leads comprising upper surfaces and bottom surfaces, the plurality of inner leads electrically connected to the semiconductor chip;
an encapsulant covering the semiconductor chip and the plurality of inner leads; and
nonconductive intermediate members interposed between the inner leads and the encapsulant to increase an adhesive strength between the inner leads and the encapsulant,
wherein portions of the bottom surfaces of the inner leads are exposed from the encapsulant and the bottom surfaces of the inner leads are disposed at a different height from a bottom surface of the encapsulant and wherein the nonconductive intermediate members have a bar shape and are disposed on an upper surface of the inner leads without extending across sidewalls of the inner leads.

2. The semiconductor package of claim 1, wherein the plurality of inner leads comprise notches or holes.

3. The semiconductor package of claim 1, wherein the nonconductive intermediate members extend across the upper surfaces of the inner leads.

4. The semiconductor package of claim 1, further comprising a chip mounting pad on which the semiconductor chip is mounted.

5. The semiconductor package of claim 4, wherein a bottom surface of the chip mounting pad is exposed from the encapsulant.

6. The semiconductor package of claim 4, wherein the chip mounting pad comprises holes or notches.

7. The semiconductor package of claim 4, further comprising an adhesive member disposed between the semiconductor chip and the chip mounting pad.

8. A semiconductor package comprising:
a semiconductor chip disposed on a chip mounting pad;
a plurality of inner leads comprising upper surfaces and bottom surfaces, the plurality of inner leads electrically connected to the semiconductor chip;
an encapsulant covering the semiconductor chip and the plurality of inner leads; and
a circuit board comprising wiring lines, wherein the wiring lines are connected to the bottom surfaces of the inner leads,
wherein portions of the bottom surfaces of the inner leads and a bottom surface of the chip mounting pad are exposed from the encapsulant, wherein the bottom surfaces of the inner leads protrude below a bottom surface of the encapsulant and the bottom surface of the chip mounting pad, and wherein the wiring lines of the circuit board are exposed by a recess formed in a surface of the circuit board such that the bottom surface of the encapsulant contacts the surface of the circuit board.

9. The semiconductor package of claim 1, wherein the bottom surfaces of the inner leads are recessed above the bottom surface of the encapsulant.

10. The semiconductor package of claim 9, further comprising a circuit board comprising wiring lines, wherein the wiring lines are connected to the bottom surfaces of the inner leads.

11. The semiconductor package of claim 10, wherein the wiring lines of the circuit board are protruded from a surface of the circuit board such that the bottom surface of the encapsulant contacts the surface of the circuit board.

12. The semiconductor package of claim 1, further comprising one or more additional semiconductor chips, wherein the additional semiconductor chips are electrically connected to the plurality of inner leads.

13. A semiconductor package comprising:
upper and lower semiconductor packages sequentially stacked,
wherein each of the upper and lower semiconductor packages comprises:
a semiconductor chip disposed on a chip mounting pad;
a plurality of inner leads comprising upper surfaces, side surfaces, and bottom surfaces, the plurality of inner leads electrically connected to the semiconductor chip; and
an encapsulant covering the semiconductor chip and the inner leads,
wherein portions of the bottom and side surfaces of the inner leads are exposed from the encapsulant, the bottom surfaces of the inner leads are disposed at a different height from a bottom surface of the encapsulant and a bottom surface of the chip mounting pad,
wherein the inner leads of the upper semiconductor package are electrically connected to the inner leads of the lower semiconductor package, and
wherein bottom surfaces of the plurality of inner leads of the upper semiconductor package and a bottom surface of the chip mounting pad of the upper semiconductor package directly contact an upper surface of the encapsulant of the lower semiconductor package.

14. The semiconductor package of claim 13, wherein the upper semiconductor package further comprises outer leads physically continuous to the inner leads and exposed from the encapsulant, wherein the outer leads of the upper semiconductor package are connected to the inner leads of the lower semiconductor package.

15. The semiconductor package of claim 13, wherein the lower semiconductor package further comprises outer leads physically continuous to the inner leads and exposed from the encapsulant, wherein the outer leads of the lower semiconductor package are connected to the inner leads of the upper semiconductor package.

16. The semiconductor package of claim 13, wherein each of the upper and lower semiconductor packages further comprises outer leads physically continuous to the inner leads and exposed from the encapsulant, wherein the outer leads of the upper semiconductor package are connected to the outer leads of the lower semiconductor package.

17. The semiconductor package of claim 16, wherein the outer leads of the upper semiconductor package are disposed at a different angle from an angle at which the outer leads of the lower semiconductor package are disposed, wherein the outer leads of the upper and lower semiconductor packages are disposed upward and soldered onto each other.

18. The semiconductor package of claim 13, wherein a portion of an upper surface of the encapsulant of the lower semiconductor package is recessed such that the encapsulant and the inner leads of the upper semiconductor package contact the encapsulant of the lower semiconductor package.

19. The semiconductor package of claim 18, wherein a bottom surface of the encapsulant of the upper semiconductor package directly contacts an upper surface of the encapsulant of the lower semiconductor package.

20. The semiconductor package of claim 18, wherein the bottom surfaces of the inner leads of the lower semiconductor package protrude below the bottom surface of the encapsulant of the lower semiconductor package.

21. The semiconductor package of claim 20, further comprising a circuit board disposed underneath the lower semiconductor package and comprising wiring lines, wherein the wiring lines of the circuit board are exposed by a recess formed in a surface of the circuit board so as to be connected to the bottom surfaces of the inner leads of the lower semiconductor package and allow the bottom surface of the encapsulant of the lower semiconductor package to contact the surface of the circuit board.

22. The semiconductor package of claim 13, wherein the bottom surfaces of the inner leads of the upper semiconductor package protrude or are recessed more than the bottom surface of the encapsulant of the upper semiconductor package.

23. The semiconductor package of claim 22, wherein the bottom surfaces of the inner leads of the lower semiconductor package are recessed more than the bottom surface of the encapsulant of the lower semiconductor package.

24. The semiconductor package of claim 23, further comprising a circuit board disposed underneath the lower semiconductor package and comprising wiring lines, wherein the wiring lines of the circuit board protrude from a surface of the circuit board so as to be connected to the bottom surfaces of the inner leads of the lower semiconductor package and allow the bottom surface of the encapsulant of the lower semiconductor package to contact the surface of the circuit board.

25. The semiconductor package of claim 13, further comprising outer leads, wherein the outer leads contact the inner leads of the upper and lower semiconductor packages.

26. The semiconductor package of claim 25, wherein the outer leads contact the side surfaces of the inner leads of the upper and lower semiconductor packages.

27. The semiconductor package of claim 25, wherein the outer leads contact the bottom surfaces of the inner leads of the upper and lower semiconductor packages.

28. The semiconductor package of claim 27, wherein a portion of an upper surface of the encapsulant of the lower semiconductor package is recessed such that the encapsulant of the upper semiconductor package contacts the encapsulant of the lower semiconductor package.

29. A semiconductor package comprising:
upper and lower semiconductor packages sequentially stacked,
wherein each of the upper and lower semiconductor packages comprises:
a semiconductor chip disposed on a chip mounting pad;
a plurality of inner leads comprising upper surfaces, side surfaces, and bottom surfaces, the plurality of inner leads electrically connected to the semiconductor chip; and
an encapsulant covering the semiconductor chip and the inner leads,
wherein portions of the bottom and side surfaces of the inner leads are exposed from the encapsulant, the bottom surfaces of the inner leads are disposed at a different height from a bottom surface of the encapsulant and a bottom surface of the chip mounting pad,
wherein the inner leads of the upper semiconductor package are electrically connected to the inner leads of the lower semiconductor package,
wherein a portion of an upper surface of the encapsulant of the lower semiconductor package is recessed such that the encapsulant and the inner leads of the upper semiconductor package contact the encapsulant of the lower semiconductor package,
wherein the bottom surfaces of the inner leads of the lower semiconductor package protrude below the bottom surface of the encapsulant of the lower semiconductor package; and
a circuit board disposed underneath the lower semiconductor package and comprising wiring lines, wherein the wiring lines of the circuit board are exposed by a recess formed in a surface of the circuit board so as to be connected to the bottom surfaces of the inner leads of the lower semiconductor package and allow the bottom surface of the encapsulant of the lower semiconductor package to contact the surface of the circuit board.

* * * * *